(12) United States Patent
Lesso et al.

(10) Patent No.: US 12,266,961 B2
(45) Date of Patent: Apr. 1, 2025

(54) APPARATUS AND METHODS FOR TRANSFERRING CHARGE

(71) Applicant: Cirrus Logic International Semiconductor Ltd., Edinburgh (GB)

(72) Inventors: John Paul Lesso, Edinburgh (GB); Toru Ido, Tokyo (JP); Claire Motion, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 341 days.

(21) Appl. No.: 17/824,687

(22) Filed: May 25, 2022

(65) Prior Publication Data

US 2023/0387705 A1 Nov. 30, 2023

(51) Int. Cl.
*H02J 7/00* (2006.01)
*G01N 27/403* (2006.01)
*G01R 31/385* (2019.01)
*H02J 7/34* (2006.01)

(52) U.S. Cl.
CPC .......... *H02J 7/0048* (2020.01); *G01N 27/403* (2013.01); *G01R 31/385* (2019.01); *H02J 7/007* (2013.01); *H02J 7/34* (2013.01)

(58) Field of Classification Search
CPC .. H02J 7/007; H02J 7/34; H02J 7/0047; H02J 7/0048; H02J 7/345; H02J 7/00714; H02J 2207/20; H02M 1/009; H02M 3/158; G01R 31/385; G01N 27/403
USPC ......................................................... 702/63
See application file for complete search history.

(56) References Cited

U.S. PATENT DOCUMENTS

| | | |
|---|---|---|
| 2002/0080631 A1 | 6/2002 | Kanouda et al. |
| 2003/0034761 A1 | 2/2003 | Goto et al. |
| 2005/0052168 A1 | 3/2005 | Tazawa et al. |
| 2006/0028188 A1 | 2/2006 | Hartular et al. |
| 2007/0278994 A1* | 12/2007 | Mayega ............... H02J 7/00711 320/107 |
| 2009/0146826 A1 | 6/2009 | Gofman et al. |
| 2009/0295344 A1 | 12/2009 | Qu |
| 2012/0112686 A1* | 5/2012 | Zhang ................... H02J 7/0013 320/107 |

(Continued)

FOREIGN PATENT DOCUMENTS

| | | |
|---|---|---|
| EP | 3591823 A1 | 1/2020 |
| WO | 02099947 A1 | 12/2002 |

(Continued)

OTHER PUBLICATIONS

International Search Report and Written Opinion of the International Searching Authority, International Application No. PCT/GB2023/051098, mailed Jul. 17, 2023.

*Primary Examiner* — John H Le
(74) *Attorney, Agent, or Firm* — Jackson Walker L.L.P.

(57) ABSTRACT

Apparatus for delivering power from a battery node of a battery to an output node, the output node coupled to an analyte monitoring device, the apparatus comprising: a slow charging path between the battery node and the output node; a fast charging path parallel to the slow charging path, the fast charging path switchably coupled between the battery node and the output node; and control circuitry configured to: selectively couple the fast charging path between the battery node and the output node to allow faster transfer of charge between the battery node and the output node than the slow charging path.

18 Claims, 8 Drawing Sheets

(56) References Cited

U.S. PATENT DOCUMENTS

2014/0070618 A1* 3/2014 Bajaj .................... H02J 7/0031
  307/66
2015/0357851 A1* 12/2015 Huang ................. H02M 3/158
  320/108
2016/0190830 A1* 6/2016 Kuhlmann ........ H02J 7/007194
  320/116

FOREIGN PATENT DOCUMENTS

| WO | 2005013455 A1 | 2/2005 |
| WO | 2015103483 A1 | 7/2015 |

\* cited by examiner

| Phase | Switches closed |
|---|---|
| 1 | S1, S4 |
| 2 | S2, S5 |

Fig. 12

| Phase | Switches closed |
|---|---|
| 1 | S1, S4 |
| 2 | S2, S6 |

Fig. 13

| Phase | Switches closed |
|---|---|
| 1 | S2, S5 |
| 2 | S3, S4 |

Fig. 14

APPARATUS AND METHODS FOR TRANSFERRING CHARGE

TECHNICAL FIELD

The present disclosure relates methods and apparatus for transferring charge from a battery to an analyte monitoring device.

BACKGROUND

Electrochemical sensors are widely used for the detection of analytes indirectly, via the detection of an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes.

Electrochemical sensors are often incorporated into battery powered devices, such as continuous glucose monitors and other analyte monitors, which periodically sample one or more voltages at the sensor to provide periodic updates relating to the concentration of analyte(s) being detected. The longer the duty cycle of sampling of the analyte by the sensor, the greater the current draw from the battery tends to be. In turn, this excess current draw results both in poor device efficiency due to ohmic losses and accelerated battery degradation due to chemical losses in the battery (the Peukert effect).

SUMMARY

Embodiments of the present disclosure aim to address or at least ameliorate one or more of the above problems by providing multiple paths for energy transfer between a battery and an analyte monitoring device, such as an electrochemical sensor. Embodiments of the present disclosure may provide two charge transfer paths. A slow, more efficient path may be provided between the battery and the sensor where current from the battery is limited, and a fast, less efficient path between the battery and the sensor where the battery is used to charge an output capacitor. Embodiments also provide smart control of the transfer of charge from the battery based on an estimated internal state of the battery, which may change over time.

According to a first aspect of the disclosure, there is provided an apparatus for delivering power from a battery node of a battery to an output node, the output node coupled to an analyte monitoring device, the apparatus comprising: a slow charging path between the battery node and the output node; a fast charging path parallel to the slow charging path, the fast charging path switchably coupled between the battery node and the output node; and control circuitry configured to: selectively couple the fast charging path between the battery node and the output node to allow faster transfer of charge between the battery node and the output node than the slow charging path.

According to another aspect of the disclosure, there is provided a method for controlling an apparatus for delivering power from a battery node of a battery to an output node, the output node coupled to an analyte monitoring device, the apparatus comprising a slow charging path between the battery node and the output node, and a fast charging path parallel to the slow charging path, the fast charging path switchably coupled between the battery node and the output node, the method comprising: selectively coupling the fast charging path between the battery node and the output node to allow faster transfer of charge between the battery node and the output node than the slow charging path.

Optionally, the slow charging path may be switchably coupled between the battery node and the output node. The control circuitry may then additionally be configured to selectively couple the slow charging path between the battery node and the output node in dependence of an internal state of the battery.

Alternatively, the slow charging path may be permanently coupled between the battery node and the output node.

The control circuitry may be configured to selectively couple the fast charging path between the battery node and the output node in dependence on an internal state of the battery. In such case, the control circuitry may be configured to measure a characteristic of the battery via the battery node; and estimate the internal state of the battery based on the characteristic.

The control circuitry may be configured to selectively coupled the fast charging path between the battery node and the output node in dependence on a duty cycle of sampling by the analyte monitoring device. In some embodiments, if the duty cycle falls below a predetermined critical duty cycle, the control circuitry may be configured to operate the apparatus in a continuous current mode in which the fast charging path is permanently coupled to the output node.

The control circuitry may be configured to selectively coupled the fast charging path between the battery node and the output node in dependence on whether the analyte monitoring device is sampling an analyte.

The control circuitry may be configured to selectively coupled the fast charging path between the battery node and the output node in dependence on an output voltage at the output node. For example, if whilst the slow charging path is selected, the output voltage falls below a threshold voltage, the fast charging path may be selected to increase current flow between the battery node and the output node.

The control circuitry may be configured to selectively couple the fast charging path between the battery node and the output node in response to a request for data from the analyte monitoring device. For example, the analyte monitoring device may indicate or request to sample the analyte between periodic samples at a duty cycle of analyte samples by the device. In which cases, the control circuitry may be configured to select the fast charging path to increase the current to the analyte monitoring device so as to ensure the analyte monitoring device receives the necessary power to obtain a sample.

The control circuitry may be configured to selectively couple the fast charging path between the battery node and the output node in response to a concentration of an analyte measured by the analyte monitoring device exceeding a high concentration threshold. For example, where the analyte is glucose, a high concentration may be associated with a hyperglycaemic event. In which case, it may be desirable to increase the rate of sampling to obtain more granularity regarding movement of the analyte concentration.

The control circuitry may be configured to selectively couple the fast charging path between the battery node and the output node in response to a concentration of an analyte measured by the analyte monitoring device falling below a low concentration threshold. For example, where the analyte is glucose, a high concentration may be associated with a hypoglycaemic event. In which case, it may be desirable to increase the rate of sampling to obtain more granularity regarding movement of the analyte concentration.

The apparatus may further comprise a load capacitor coupled between the output node and a first reference voltage. In doing so, during periods in which no analyte sampling is taking place, the load capacitor may be charged by the battery via the slow charging path.

The slow charging path may have a higher resistance than the fast charging path. Thus, the rate of transfer of charge via the slow charging path may be lower than that of the fast charging path.

The slow charging path may comprise a reservoir capacitor coupled between a reservoir node in the slow charging path and a second reference voltage. A first voltage regulator may be coupled between the battery node and the reservoir node for regulating a reservoir voltage at the reservoir node.

The apparatus may further comprise a second voltage regulator coupled between the reservoir node and the output node for regulating an input voltage at the output node. The fast charging path optionally passes through the reservoir node and the second voltage regulator.

The apparatus may further comprise a third voltage regulator in the fast charging path configured to regulate the input voltage at the output node when the fast charging path is coupled between the battery node and the output node.

The first voltage regulator may comprise first and second inductor nodes for coupling an inductor therebetween. A switching network may be configured to switchably couple the first inductor node to one or more of the battery node, the output node and a second voltage reference node. The switching network may be configured to switchably couple the second inductor node to one or more of the reservoir node, the output node and the second voltage reference node.

The fast charging path and the slow charging path may pass through the switching network.

According to another aspect of the disclosure, there is provided an apparatus for delivering power to an analyte monitoring device via an output node, the apparatus comprising: the output node; a primary battery having a battery node; a slow charging path coupled between the battery node and the output node; a fast charging path switchably coupled between the battery node and the output node, the fast charging path having a higher current limit than the slow charging path.

The apparatus may further comprise control circuitry for selectively coupling the fast charging path between the battery node and the output node to allow faster transfer of charge between the battery node and the output node than the slow charging path.

The slow charging path may be switchably coupled between the battery node and the output node. The control circuitry may be configured to selectively couple the slow charging path between the battery node and the output node in dependence of an internal state of the battery.

The slow charging path may be permanently coupled between the battery node and the output node.

The control circuitry may be configured to selectively couple the fast charging path between the battery node and the output node in dependence on one or more of: an internal state of the battery; a duty cycle of sampling by the analyte monitoring device; whether the analyte monitoring device is sampling an analyte; and an output voltage at the output node.

The control circuitry may be configured to measure a characteristic of the battery via the battery node; and estimate the internal state of the battery based on the characteristic.

The control circuitry may be configured to select the fast charging mode when the duty cycle falls below a duty cycle threshold.

The control circuitry may be configured to select the fast charging mode when the voltage falls below a threshold output voltage.

The control circuitry may be configured to selectively couple the fast charging path between the battery node and the output node in response to one or more of a request for data from the analyte monitoring device; a concentration of an analyte measured by the analyte monitoring device exceeding a high concentration threshold; and a concentration of an analyte measured by the analyte monitoring device falling below a low concentration threshold.

The apparatus may further comprise a load capacitor coupled between the output node and a first reference voltage.

The slow charging path may have a higher resistance than the fast charging path.

The slow charging path may comprise a reservoir capacitor coupled between a reservoir node in the slow charging path and a second reference voltage; and a first voltage regulator coupled between the battery node and the reservoir node for regulating a reservoir voltage at the reservoir node.

The apparatus may further comprise a second voltage regulator coupled between the reservoir node and the output node for regulating an input voltage at the output node.

The fast charging path may pass through the reservoir node and the second voltage regulator.

The apparatus may further comprise a third voltage regulator in the fast charging path configured to regulate the input voltage at the output node when the fast charging path is coupled between the battery node and the output node.

The first voltage regulator may comprise first and second inductor nodes for coupling an inductor therebetween; and a switching network. The switching network may be configured to switchably couple the first inductor node to one or more of the battery node, the output node and a second voltage reference node. The switching network may be configured to switchably couple the second inductor node to one or more of the reservoir node, the output node and the second voltage reference node.

The fast charging path and the slow charging path may pass through the switching network.

According to another aspect of the disclosure, there is provided an apparatus for delivering power from a battery node of a battery to an output node, the output node coupled to an analyte monitoring device, the apparatus comprising: configurable charge transfer circuitry for transferring charge between the battery node and the output node, the charge transfer circuitry operable in a slow charging mode; and a fast charging mode, the fast charging mode allowing faster transfer of charge between the battery node and the output node; and control circuitry operable to select one of the slow charging mode and the fast charging mode based on one or more of: a characteristic of the battery; a duty cycle for drawing current from the battery; and an output voltage at the output node.

The control circuitry may be configured to measure a characteristic of the battery via the battery node; and estimate the internal state of the battery based on the characteristic. The control circuitry may then select between the fast charging mode and the slow charging mode for delivery of power from the battery node to the output node based on the estimated internal state of the battery.

The control circuitry may be configured to select the fast charging mode when the duty cycle falls below a duty cycle threshold.

The control circuitry is configured to select the fast charging mode when the voltage falls below a threshold output voltage.

The control circuitry may be configured to selectively couple the fast charging path between the battery node and the output node in response to a request for data from the analyte monitoring device. For example, the analyte monitoring device may indicate or request to sample the analyte between periodic samples at a duty cycle of analyte samples by the device. In which cases, the control circuitry may be configured to select the fast charging path to increase the current to the analyte monitoring device so as to ensure the analyte monitoring device receives the necessary power to obtain a sample.

The control circuitry may be configured to selectively couple the fast charging path between the battery node and the output node in response to a concentration of an analyte measured by the analyte monitoring device exceeding a high concentration threshold. For example, where the analyte is glucose, a high concentration may be associated with a hyperglycaemic event. In which case, it may be desirable to increase the rate of sampling to obtain more granularity regarding movement of the analyte concentration.

The control circuitry may be configured to selectively couple the fast charging path between the battery node and the output node in response to a concentration of an analyte measured by the analyte monitoring device falling below a low concentration threshold. For example, where the analyte is glucose, a high concentration may be associated with a hypoglycaemic event. In which case, it may be desirable to increase the rate of sampling to obtain more granularity regarding movement of the analyte concentration.

The apparatus may further comprise a load capacitor coupled between the output node and a first reference voltage. In doing so, during periods in which no analyte sampling is taking place, the load capacitor may be charged by the battery via the slow charging path.

The charge transfer circuitry may comprise a slow charging path; and a fast charging path. In the slow charging mode, the charge transfer circuitry may be configured to transfer charge via the slow charging path. In the fast charging mode, the charge transfer circuitry may be configured to transfer charge via the fast charging path.

The slow charging path may have a higher resistance than the fast charging path. Thus, the rate of transfer of charge via the slow charging path may be lower than that of the fast charging path.

The slow charging path may comprise a reservoir capacitor coupled between a reservoir node in the slow charging path and a second reference voltage. A first voltage regulator may be coupled between the battery node and the reservoir node for regulating a reservoir voltage at the reservoir node.

The apparatus may further comprise a second voltage regulator coupled between the reservoir node and the output node for regulating an input voltage at the output node. The fast charging path optionally passes through the reservoir node and the second voltage regulator.

The apparatus may further comprise a third voltage regulator in the fast charging path configured to regulate the input voltage at the output node when the fast charging path is coupled between the battery node and the output node.

The first voltage regulator may comprise first and second inductor nodes for coupling an inductor therebetween. A switching network may be configured to switchably couple the first inductor node to one or more of the battery node, the output node and a second voltage reference node. The switching network may be configured to switchably couple the second inductor node to one or more of the reservoir node, the output node and the second voltage reference node.

The fast charging path and the slow charging path may pass through the switching network.

According to another aspect of the disclosure, there is provided an apparatus for delivering power from an battery node of a battery to an output node, the output node coupled to an analyte monitoring device, comprising: the input node for receiving a battery voltage; the output node for delivery of an output voltage; a reservoir capacitor; an inductor; and charge transfer circuitry operable in: a first mode for charging the reservoir capacitor from the battery voltage over a first path having a first current limit; a second mode for discharging the reservoir capacitor to the output node over a second path having a second current limit higher than the first current limit; a third mode for transferring charge from the input node to the output node over a third path comprising the inductor; and a fourth mode for transferring charge from the input node to the output node over a fourth path, the fourth path being a purely resistive path.

Optionally, the apparatus may further comprise a first load capacitor coupled between the output node and a first reference voltage node.

Alternatively, the apparatus may further comprise a first load capacitor switchably coupled between the output node and a first reference voltage node; and a second load capacitor switchably coupled between the output node and a second reference voltage node. The first reference voltage node and the second reference voltage node may be at the same voltage and/or the same voltage node.

The apparatus may further comprise control circuitry configured to operate the charge transfer circuitry in one of the first, second, third and fourth modes in dependence on one or more of: an internal state of the battery; a duty cycle of sampling by the analyte monitoring device; whether the analyte monitoring device is sampling an analyte; an output voltage at the output node.

The apparatus may further comprise control circuitry configured to operate the charge transfer circuitry in one of the first, second, third and fourth modes in response to one or more of: a request for data from the analyte monitoring device; a concentration of an analyte measured by the analyte monitoring device exceeding a high concentration threshold; and a concentration of an analyte measured by the analyte monitoring device falling below a low concentration threshold.

According to another aspect of the disclosure, there is provided a system comprising: an apparatus as described herein; and an analyte monitoring device as described herein. The system may further comprise a host device in communication with the apparatus and/or the analyte monitoring device.

According to another aspect of the disclosure, there is provided a device comprising an apparatus or system as described above.

According to another aspect of the disclosure, there is provided a continuous glucose monitor comprising an apparatus or system as described above.

In any of the aspects described above, the analyte may be glucose, a ketone, oxygen or a lactate.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which:

FIGS. 12 to 14 are tables showing example switching regimes for the circuit shown in FIG. 11;

DESCRIPTION OF EMBODIMENTS

Embodiments of the present disclosure relate to methods of regulating power transfer between batteries and analyte monitoring devices. Methods are described for monitoring characteristics of a battery associated with a battery state of the battery and regulating the transfer of charge from the battery to a analyte monitoring device based on the monitored characteristic.

Figure 1:
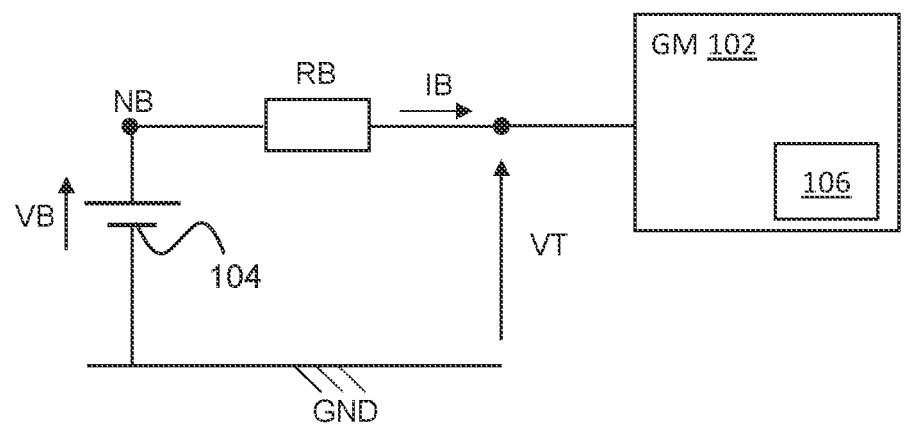
FIG. 1 is a schematic diagram of a conventional power supply for powering an analyte monitoring device.

FIG. 1 is a schematic diagram of a conventional portable analyte monitoring system 100. The system 100 comprises a analyte monitoring (AM) device 102 and a battery 104 (which may comprise one or more battery cells). The AM device 102 comprises an electrochemical sensor 106 (or electrochemical cell) consisting of two or more electrodes configured for contact with an analyte whose concentration is to be ascertained. The AM device 102 also comprises circuitry for driving one or more of the electrodes and for measuring a response at one or more of the electrodes. The battery 104 has a voltage VB, an output impedance RB, and supplies a current IB to the AM device 102. The voltage seen across the terminals of the battery 104 is denoted VT.

The battery 104 may be a primary battery (comprising one or more primary cells). The term "primary cell" used herein refers to an electric cell that produces current by an irreversible chemical reaction. The term "primary battery" refers to a battery comprising one or more primary cells. Such cells cannot easily be recharged and tend to be discarded following discharge. In contrast, a secondary cell is an electric cell that can be recharged and therefore can be reused.

The AM device 102 may be configured to periodically sample or measure a voltage at an electrochemical sensor corresponding to a concentration of the analyte to be measured (for example, glucose). To do so, the AM device 102 may cycle through phases of activity (during which a measurement is taken) and inactivity (during which the AM device 102 may be powered down). The duty cycle of this activity vs inactivity may be fixed or variable. To obtain a measurement/sample, the AM device 102 may be configured to power up and/or activate power intensive circuitry. Doing so leads to a spike in current draw from the battery 104. As the period between measurements obtained by the AM device 102 increases, the current drawn from the battery 104 during sampling also increases when compared to measurements obtained over shorter periods.

It will be appreciated that drawing a large current from a battery, for example to perform measurements at the electrochemical cell 106, has some drawbacks with regard to efficiency. These drawbacks are accentuated in the field of portable sensors, since a typical battery used for such applications incorporates one or more silver oxide (AgO) cells. Such cells have a relatively high output impedance when compared to other battery technologies; in the region of about 20Ω to about 60Ω. Drawing a large current from a battery with such a high output impedance can lead to both ohmic loss and chemical loss, as will be described in more detail below.

As noted above, the battery has voltage VB across its terminals, an output impedance RB, and supplies a current IB to the AM device 102. The power drawn from the battery 104 when providing power to the AM device 102 may be defined as:

$$P_O = V_B I_B - I_B^2 R_B$$

$$V_T = V_B - I_B R_B$$

The efficiency may therefore be defined as:

$$\eta_B = \frac{V_T I_B}{V_B I_B} = 1 - R_B \frac{I_B}{V_B}$$

In a typical use case, the AM device 102 may draw 7 mA for 7 seconds every 5 minutes. Assuming an output impedance of the battery 104 of 400 (typical for a silver oxide cell) and a voltage VB of 1.55 V, this gives an efficiency $\eta_B$ of 82%. In contrast, if a continuous current of 163 uA were to be drawn from the battery 104, the battery 104 would operate with very little ohmic loss, at an efficiency of 99.5%.

In addition to ohmic losses, silver oxide (AgO) cells tend to experience a large drop in capacity with increasing current.

Figure 2:
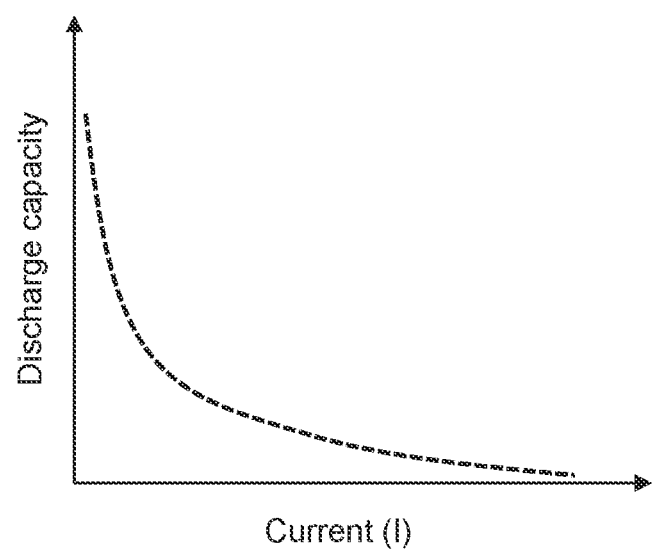
FIG. 2 is a graph of discharge capacity vs discharge current for a battery.

FIG. 2 is a graph showing discharge capacity vs load current for a typical silver oxide cell. According to Peukert's law, as the current increases and therefore the rate of discharge of the battery cell increases, the discharge capacity of the cell decreases. The discharge capacity Q may be defined by the following equation.

$$Q = \frac{Q_0}{1 + \left(\frac{I_{LOAD}}{I_\Delta}\right)^\alpha}$$

Where $Q_O$ is the nominal capacity, $I_{LOAD}$ is the load current, $I_\Delta$ is the current that results in a 50% capacity and a is a tuning term related to different battery technologies.

From the above equation, the efficiency of the battery may be defined as:

$$\eta = \frac{1}{1 + \left(\frac{I_{LOAD}}{I_\Delta}\right)^\alpha}$$

Thus, it can be seen that both the capacity and the efficiency of a battery is inversely proportional to its rate of discharge, and this relationship is particularly significant for silver oxide cells.

Embodiments of the present disclosure aim to address or at least ameliorate one or more of the above issues associated with portable device battery degradation. To do so, various embodiment provide circuitry comprising multiple paths for energy transfer between a battery and sensor circuitry. A first (slower and more efficient charge transfer path) is provided between the battery and the sensor circuitry where current from the battery is limited. A second (faster, less efficient) charge transfer path is provided between the battery and the sensor which provides power to the sensor circuitry at a faster rate.

Figure 3:
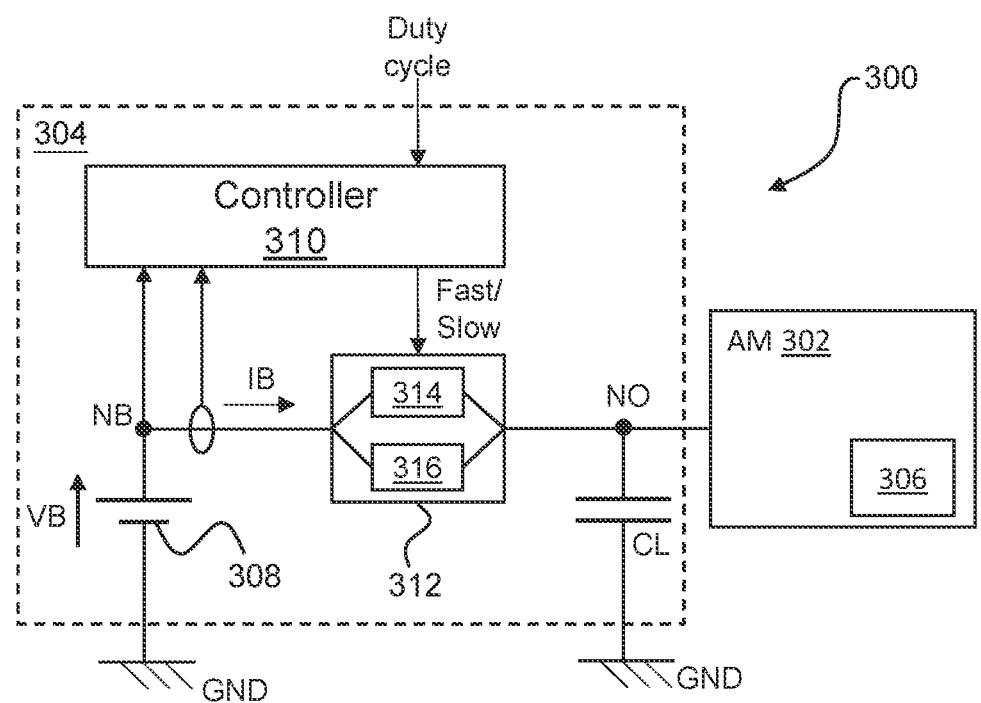
FIG. 3 is a schematic diagram of a analyte monitoring system according to embodiments of the present disclosure.

FIG. 3 is a schematic diagram of a analyte monitoring system 300 according to embodiments of the present disclosure. The system 300 comprises a analyte monitoring (AM) device 302 and a power supply 304. The AM device 302 may be similar to the AM device 102 described above. Accordingly, like the AM device 102, the AM device 302 comprises an electrochemical sensor 306 (or electrochemical cell) consisting of two or more electrodes configured for contact with an analyte whose concentration is to be ascertained. The AM device 302 also comprises circuitry (not shown) for driving one or more of the electrodes and for measuring a response at one or more of the electrodes.

The power supply 304 comprises a battery 308, a controller 310, charge transfer circuitry 312 and a load capacitor CL. Like the battery 104 of the system 100, the battery 308 may be a primary battery (comprising one or more primary cells).

Figure 4:
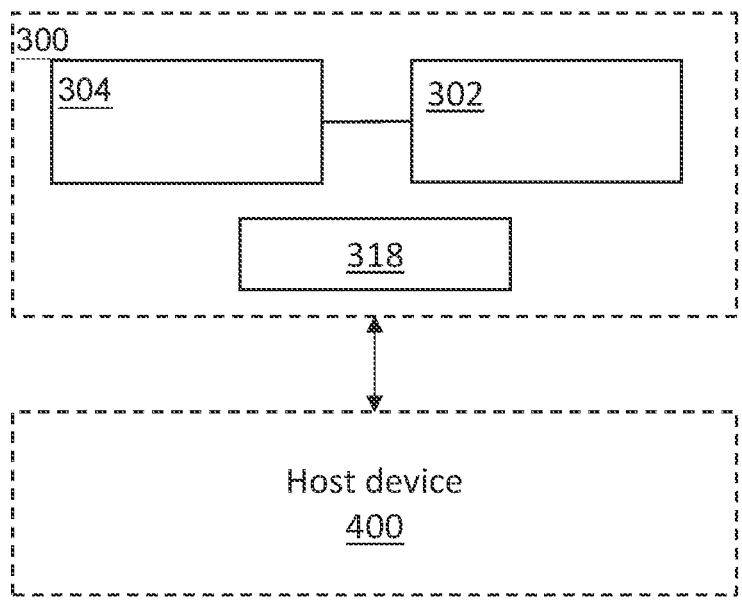
FIG. 4 is a block diagram of the analyte monitoring system of FIG. 3 in communication with a host device.

Referring to FIG. 4, the system 300 may be in temporary or permanent communication with a host device 400. As such, the system 300 may comprise interface circuitry 318 for communicating (preferably wirelessly) with the host device 400. The system 300 may receive requests from the host device 400 for data pertaining to measurements performed by the AM device 302. The system 300 may be configured to send such data to the host device 300 via the interface circuity 318. It will be appreciated that transmission to or from the interface circuitry 318 will also drain current from the battery 308.

The host device may be a portable and/or battery powered host device such as a mobile computing device for example a mobile telephone (such as a smartphone), laptop or tablet computer, a games console, a remote-control device, a home automation controller or a domestic appliance including a domestic temperature or lighting control system, a toy, a machine such as a robot, an audio player, a video player, or a mobile telephone for example a smartphone.

Referring again to FIG. 3, the battery 308 may be similar to the battery 104 described above with reference to FIG. 1. As such, like the battery 104, the battery 308 has a voltage VB across its terminals, an output impedance RB, and supplies a current IB to the AM device 302.

The charge transfer circuitry 312 may comprise a fast charging path 314 and a slow charging path 316. Each charging path 314, 316 is switchably coupled between a battery node NB and an output node NO. The output node NO is coupled to the AM device 302 for providing power to the AM device 302. The battery node NB is coupled to a terminal of the battery 308. Various exemplary implementations of the charge transfer circuitry 312 are envisaged, some of which are described in detail below.

The load capacitor CL is coupled between the output node NO and a voltage reference, in this case ground (GND).

The controller 310 is configured to monitor one or more characteristics of the battery 308. The one or more characteristics may comprise the voltage VB as measured at the battery node NB, and/or the current IB flowing between the battery node NB and the charge transfer circuitry 312.

In addition to monitoring one or more characteristics of the battery 308, the controller 310 may also receive an indication of the duty cycle of sampling by the AM device 108. The duty cycle may represent the ratio of the time spent sampling the analyte by the FM device 108 (i.e. active time or activity) vs the time spent not sampling the analyte (i.e. inactive time or inactivity).

Based on the one or more measured characteristics of the battery 308, the controller 310 may control the charge transfer circuitry 312 to switch between a fast charge transfer mode in which the rate of transfer of charge from the battery 308 to the AM device 302 is relatively high, and a slow charge transfer mode in which the rate of transfer of charge from the battery 308 to the AM device 302 is relatively low. The controller 310 may also take into account the duty cycle of the AM device 302 when determining whether to operate the charge transfer circuitry 312 in the fast mode or the slow mode.

The fast mode may be used in circumstances where the AM device 302 requires more power. Examples of such scenarios include start up of the AM device 302, a high power operation of the AM device 302.

When deciding to switch between fast and slow modes for drawing power from the battery 308, the controller 310 may estimate the internal state of the battery 308. Such an estimation may be based on a given load. The given load may be estimated based on one or more of the duty cycle of the AM device 302 and the current IB being drawn from the AM device 302.

The controller 310 may then be configured to adjust the mode of operation (e.g. fast or slow). Additionally or alternatively, where the charge transfer circuitry comprises one or more DC/DC converters, the controller 310 may be configured to vary one or more parameters of those DC/DC converter(s).

In some embodiments, an equivalent circuit model (ECM) may be estimated for the battery 308. ECM modelling methods are known in the art and so will not be described in detail here. The extracted ECM may then be used to determine an optimum mode for transferring charge from the battery 308 to the AM device 302.

Figure 5:
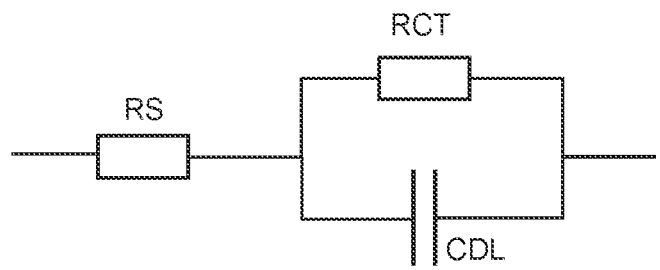
FIG. 5 is an example equivalent circuit model (ECM) for the battery of the system in FIG. 3.

As an example, FIG. 5 shows an example ECM for the battery 308. The battery 308 may be modelled as having a first resistance RS, a charge transfer resistance RCT and a double layer capacitance CDL. The first resistor RS is provided in series with the parallel combination of the charge transfer resistor RCT and the double layer capacitor CDL. The first resistance represents ohmic losses in the lead and the electrolyte of the battery 308. The charge transfer resistor RCT represents the charge transfer impedance of the battery 308 itself. The capacitor CDL represents the double layer capacitance at the electrodes of the battery 308.

As the battery 308 ages, the charge transfer resistance RCT will increase due to irreversible chemical processes taking place at the electrodes of the battery 308. Under the assumption that the on pulses (in which current is drawn from the battery 308) are smaller than the time constant RCT*CDL, the power loss when operating in a pulsed mode with a duty cycle D can be approximated as:

$$P_{PULSED} = I_B^2 R_S$$

In contrast, when an equivalent continuous current is drawn from the battery 308 which exploits off time of the cell to reduce current spikes, losses in the battery 308 can be approximated to:

$$P_{cont} = \left(\frac{I_B}{D}\right)^2 (R_S + R_{CT})$$

Hence, there exists a critical resistance RCRIT for RCT, below which continuous current draw from the battery 308 may be best and above which pulsed current draw from the battery 308 may be best. This critical resistance RCRIT may be defined as follows by:

$$R_{CRIT} = \frac{R_S - D^2 R_S}{D^2}$$

Hence, when the battery 308 is relatively new (not aged), for a given set of conditions, it may be preferable to initially transfer charge from the battery 308 to the AM device 302 by drawing a continuous current (e.g. operating the charge transfer circuitry 312 in a slow mode). However, when the battery becomes more aged, the controller 310 may allow large current spikes (e.g. operating the charge transfer circuitry 312 in a fast mode).

As an example, consider the following:

$$I_B = 1A; R_S = 1\Omega; D = 0.1$$

Using the above equation for RCRIT:

$$R_{CRIT} = 99\ \Omega$$

So if initially RCT is substantially lower than RCRIT (99 Ω) at say, RCT=100, then:

$$P_{cont} = 11\ W$$

$$P_{PULSED} = 100\ W$$

As such, a continuous current draw will be the most efficient way to discharge the battery 308 to the AM device 302.

If then over time RCT increases to above RCRIT to, say, RCT=200Ω, then:

$$P_{cont} = 200\ W$$

$$P_{PULSED} = 100\ W$$

In this situation, losses associated with continuous discharge are higher.

Thus, by monitoring one or more characteristics of the battery 308, the controller 310 can determine a mode in which to operate the charge transfer circuitry 312.

In addition to or as an alternative to determining a critical resistance RCRIT, it is also possible to determine a critical duty cycle, DCRIT, below which it is preferable to pulse the power supply.

The point at which the power drawn in a continuous mode and a pulsed mode are the same may be defined as follows:

$$P_{CONTINUOUS} = P_{PULSED}$$

$$\left(\frac{I_B}{D_{CRIT}}\right)^2 (R_S + R_{CT}) = I_B^2 R_S$$

Hence, DCRIT may be given by:

$$D_{CRIT} = \sqrt{\frac{R_S}{R_S + R_{CT}}}$$

Thus, if the duty cycle is below the above value, it may be preferable to draw current continuously from the battery.

As such, in some embodiments, the controller 310 may monitor or have knowledge of a duty cycle of the AM device 302 and adjust operation of the charge transfer circuitry 312 accordingly. For example, the controller 310 may be configured to operate the charge transfer circuitry 312 in a continuous current draw mode when the duty cycle falls below the critical duty DCRIT. Additionally or alternatively, if the duty cycle is at or above the critical duty DCRIT, the controller 310 may operate the charge transfer circuitry 312 in a pulsed mode.

Referring again to FIG. 3, various implementations of the charge transfer circuitry 312 will now be described.

Figure 6:
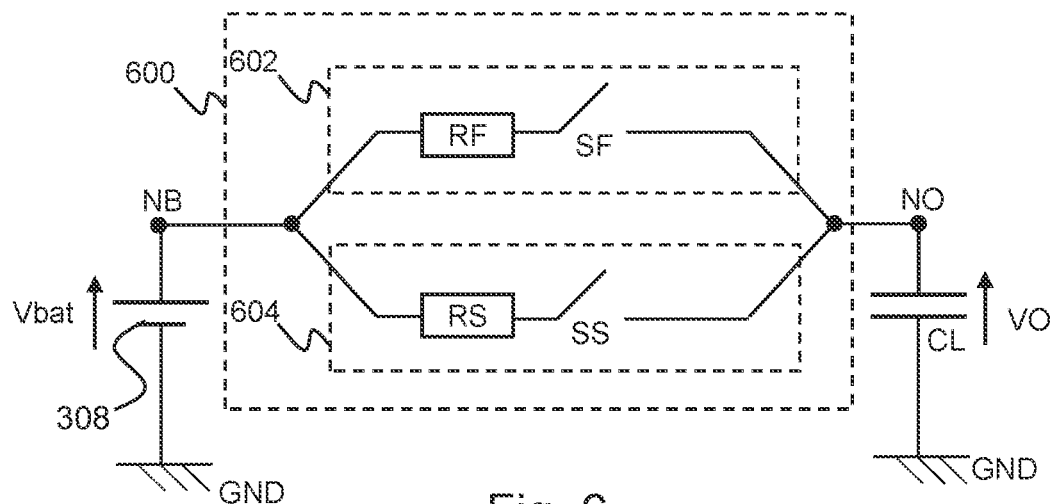
FIG. 6 is a schematic diagram of example charge transfer circuitry according to embodiments of the disclosure.

FIG. 6 is a circuit diagram of an exemplary charge transfer circuitry 600 according to some embodiments which may be implemented as the charge transfer circuitry 312 of FIG. 3. The charge transfer circuitry 600 comprises a fast charging path 602 and a slow charging path 604. Each of the fast and slow charging paths 602, 604 are coupled between the battery node NB and the output node NO.

The fast charging path comprises a fast charge resistor RF in series with a fast charging switch SF. The slow charging path comprises a slow charge resistor RS in series with a slow charging switch SS. The resistance of the fast charge resistor RF is less than the resistance of the slow charge resistor RS, such that charge transfer rate between the battery node NB and the output node NO is slower through the slow charging path 604 than through the fast charging path 602. In some embodiments, the fast charge resistor RF may be omitted altogether.

The fast and slow charging switches SF, SS may be controlled by the controller 310. As such, the controller 310 may be configured to switch to the fast charging path 602 by closing the fast charging switch SF and opening the slow charging switch SS. Conversely, to switch to the slow charging path 604, the controller 310 may be configured to open the fast charging switch SF and close the slow charging switch SS.

Whilst the charge transfer circuitry 600 shown in FIG. 6 comprises the slow charging switch SS, in other embodiments the slow charging switch SS may be omitted. In which case, the slow charging path 604 may be permanently coupled between the battery node NB and the output node NO. The controller 310 may be configured to switch the fast charging path 602 only. As such, in a fast charging mode, both the fast and slow charging paths 602, 604 are coupled between the battery node NB and the output node NO.

It will be appreciated that whilst the charge transfer circuitry 600 of FIG. 6 is very simple and therefore cost effective to implement, such an implementation provides no regulation of the current IB provided to the AM device 302.

Figure 7:
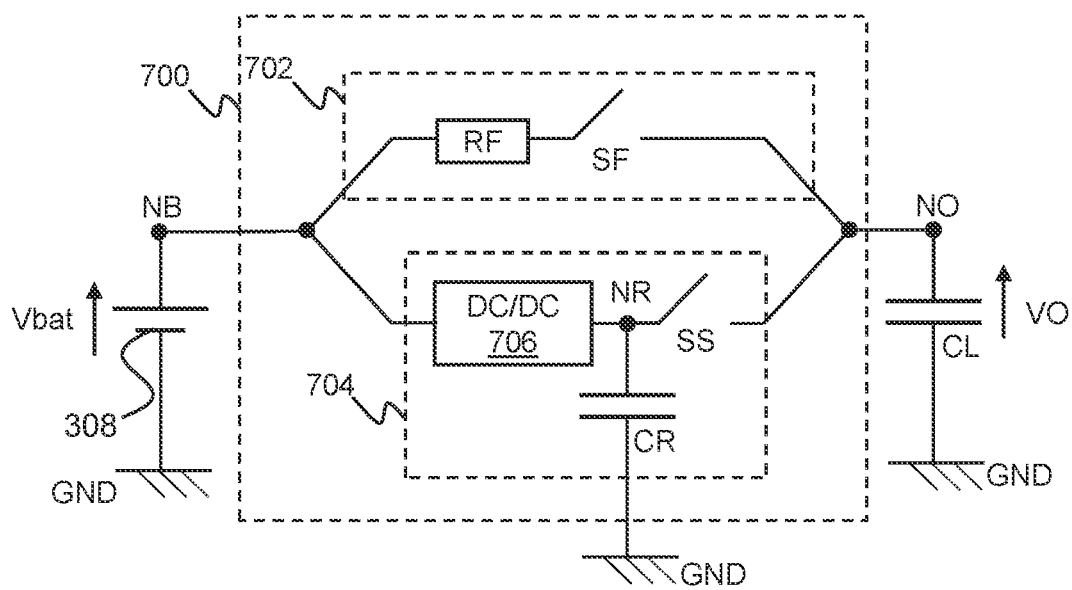
FIG. 7 is a schematic diagram of example charge transfer circuitry according to embodiments of the disclosure.

FIG. 7 is a schematic diagram of an exemplary charge transfer circuitry 700 according to some embodiments which may be implemented as the charge transfer circuitry 312 of FIG. 3. The charge transfer circuitry 700 comprises a fast charging path 702 and a slow charging path 704. Each of the fast and slow charging paths 702, 704 are coupled between the battery node NB and the output node NO.

The fast charging path 702 is similar to the fast charging path 602 of the charge transfer circuitry 600 shown in FIG. 6 and comprises a fast charge resistor RF in series with a fast charge switch SF. In some embodiments, the fast charge resistor RF can be omitted, the switch SF coupled between the battery and output nodes NB, NO. The slow charging path 704 comprises a DC/DC converter 706 coupled between the battery node NB and a reservoir node NR. The DC/DC converter 706 may be implemented using a suitable known converter implementation. For example, the DC/DC converter 706 may be implemented as a switched capacitor DC/DC converter, such as a capacitive xN DC/DC converter. In a capacitive xN DC/DC converter, capacitors are stacked in parallel to charge and connected in series to discharge, as is known in the art. In another example, the DC/DC converter 706 may be implemented as a buck or boost DC/DC inductive converter. An advantage of inductive DC/DC converters is that the inductor current may be monitored in order to limit peak current drawn from the battery 308, for example to limit losses associated with high current draw.

In some embodiments, the DC/DC converter 706 is a boost converter. A slow charge switch SS is coupled between the reservoir node NR and the output node NO. The slow charge switch SS is optional and may be omitted in some embodiments. The slow charging path 704 further comprises a reservoir capacitor CR coupled between the reservoir node NR and a reference voltage, in this case ground GND.

The controller 310 may be configured to control the switches SR, SS as well as the DC/DC converter 706. As such, the controller 310 may be operable to both regulate charging of the reservoir capacitor CR and switch charge transfer from the battery node to the output node NO via either the fast charging path 702 or the slow charging path 704.

As noted above, the AM device 302 may take samples of the analyte periodically, between which times the AM device 302 may be operated in a low power state. In a slow charge mode of operation, with the AM device 302 in the low power state, the battery voltage VB is transferred onto the reservoir capacitor CR to charge the reservoir capacitor CR. When the AM device 302 is activated to sample the analyte, charge stored on the reservoir capacitor CR is then discharged to the AM device 302. Upon completion of sampling of the analyte, the AM device 302 may then return to the low power state, and the reservoir capacitor CR begins to charge up again from the battery 308. The controller 310 may be configured to control the DC/DC converter 706 to regulate the amount of charge being transferred from the battery 308 to the reservoir capacitor CR. As such, the rate of discharge of the battery 308 can be controlled and any spikes in discharge rate minimized.

There may be instances in which a large current IB is required to power the AM device 302 and the reservoir capacitor CR does not have sufficient charge stored to provide the necessary current IB to the AM device 302. For example, the AM device 302 may be instructed by the host device 400 to sample the analyte at a faster rate. For example, the AM device 302 may be performing a more demanding sampling operation in which the large current is required. In such circumstances, the controller 310 may open the slow charge switch SS and close the fast charge switch SF coupling the battery 308 directly to the output node NO, via the optional fast charge resistor RF. In doing so, the rate of discharge of the battery 308 will increase, leading to ohmic losses and a degradation of the capacity of the battery 308. As such, it may be preferable to keep operation of the fast charge path 702 to a minimum, particularly when the battery 308 is relatively new (i.e. at proportionally high capacity).

Figure 8:
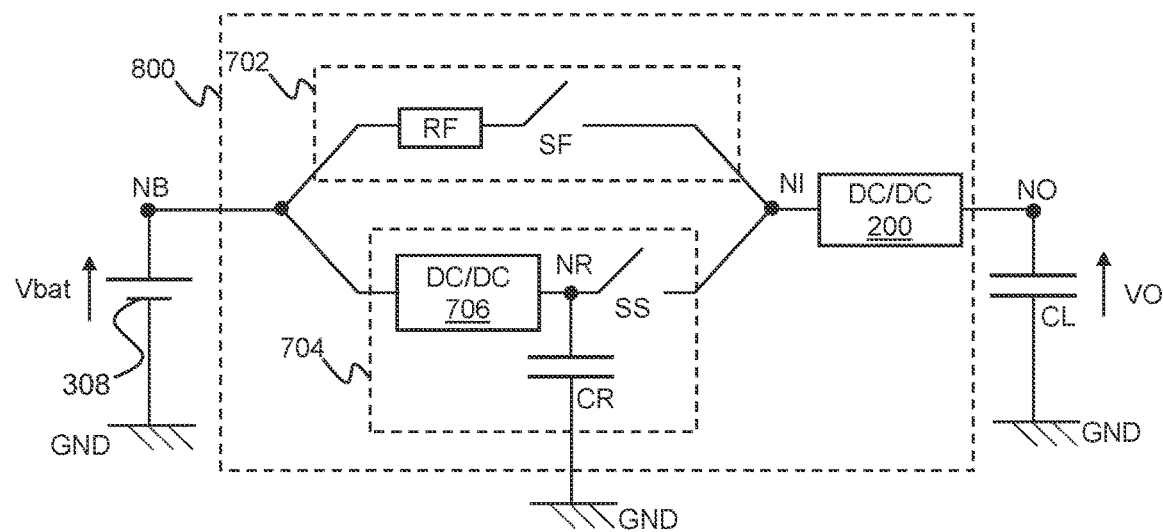
FIG. 8 is a schematic diagram of example charge transfer circuitry according to embodiments of the disclosure.

FIG. 8 is a schematic diagram of an exemplary charge transfer circuitry 800 according to some embodiments which is a variation of the charge transfer circuitry 700 shown in FIG. 7. Like parts have been given like reference numerals. The charge transfer circuitry 800 differs from the charge transfer circuitry 700 of FIG. 7 with the addition of a second DC/DC converter 802 coupled between the output node NO and an interim node NI. The fast charge and slow charge switches SF, SS are coupled to the interim node NI instead of the output node NO. The controller 310 may be configured to control operation of the DC/DC converter to regulate the output voltage VO at the output node NO.

Figure 9:
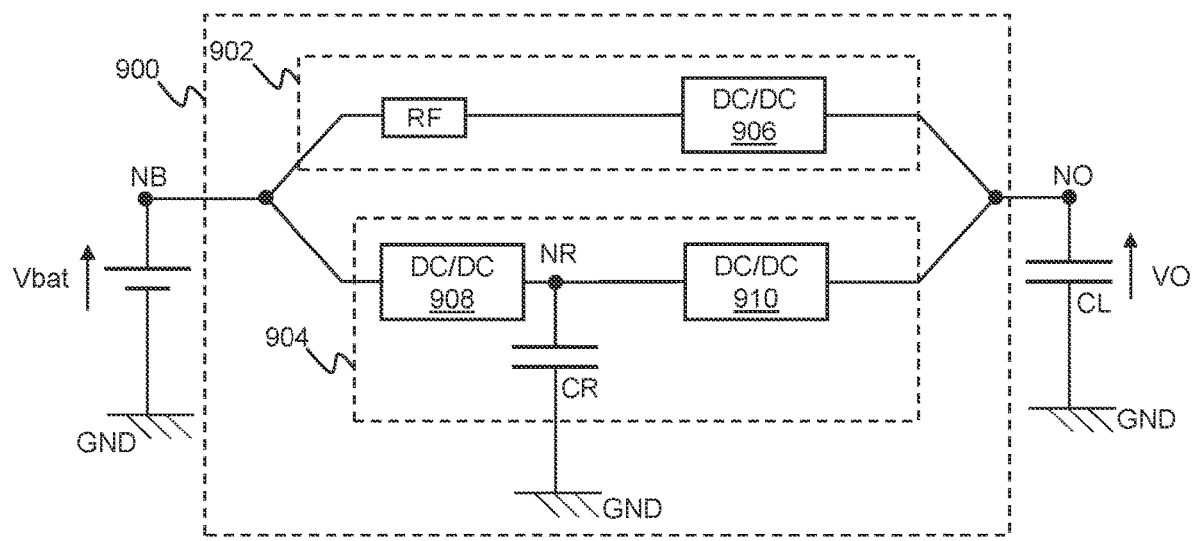
FIG. 9 is a schematic diagram of example charge transfer circuitry according to embodiments of the disclosure.

FIG. 9 is a schematic diagram of an exemplary charge transfer circuitry 900 according to some embodiments which may be implemented as the charge transfer circuitry 312 of FIG. 3. The charge transfer circuitry 900 comprises a fast charging path 902 and a slow charging path 904. Each of the fast and slow charging paths 902, 904 are coupled between the battery node NB and the output node NO.

The fast charging path 902 comprises a fast charge resistor RF and a first DC/DC converter 906 coupled in series between the battery node NB and the output node NO. The slow charging path 904 comprises a second DC/DC converter 908 coupled between the battery node NB and a reservoir node NR. A third DC/DC converter 910 is coupled between the reservoir node NR and the output node NO. A reservoir capacitor CR is coupled between the reservoir node and a reference voltage, in this case ground (GND).

The controller 310 may be configured to control each of the first, second and third DC/DC converters 906, 908, 910. For example, the first DC/DC converter 906 may be controlled to regulate charge transfer between the battery 308 and the output node NO via the fast charging path 902. For example, the second DC/DC converter 908 may be controlled to regulate charge transfer from the battery 308 to the reservoir capacitor CR. For example, the third DC/DC converter 910 may be controlled to regulate charge transfer from the reservoir capacitor CR to the output node NO. As such, in some embodiments, the second and third DC/DC converters 908, 910 are controlled so as to continuously charge the reservoir capacitor whilst regulating discharge of the reservoir capacitor CR to the output node NO (either to the AM device 302 or to charge the load capacitor CL).

In some embodiments, the reservoir and load capacitors CR, CL need never be charged at the same time. Accordingly, in some embodiments, a single DC/DC converter can be shared between fast and slow charging paths.

Figure 10:
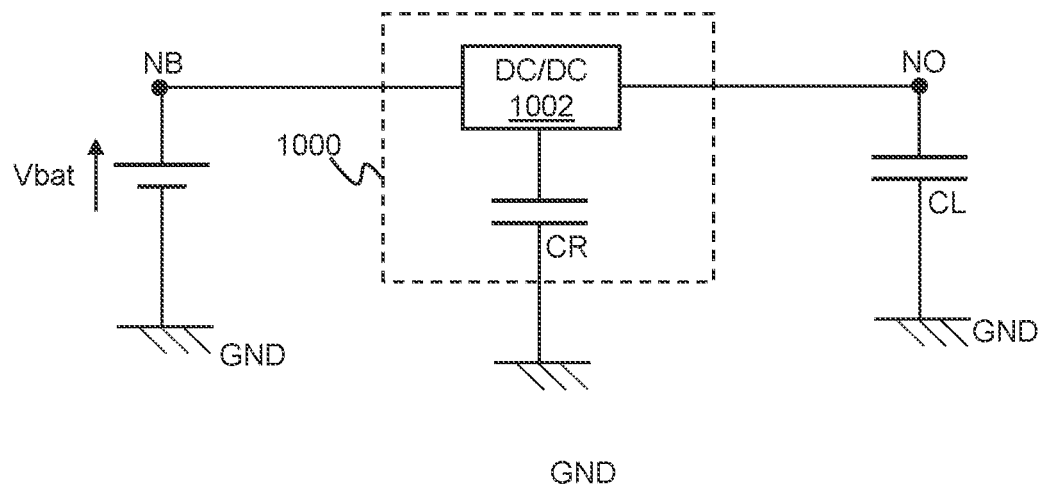
FIG. 10 is a schematic diagram of example charge transfer circuitry according to embodiments of the disclosure.

FIG. 10 is a schematic diagram of an exemplary charge transfer circuitry 1000 according to some embodiments which may be implemented as the charge transfer circuitry 312 of FIG. 3. The charge transfer circuitry 1000 comprises a single DC/DC converter 1002 and a reservoir capacitor CR. The DC/DC converter 1002 may comprise an inductor in combination with switching network operable to switch the battery voltage VB between charging the reservoir capacitor CR and supplying the load capacitor CL and/or the output node NO.

Figure 11:
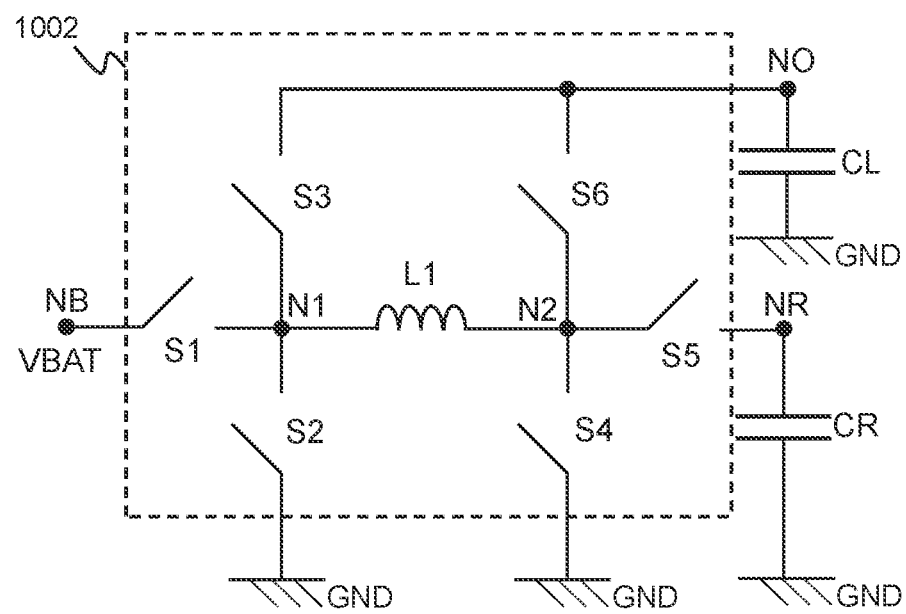
FIG. 11 is a circuit diagram of an example implementation of the charge transfer circuitry shown in FIG. 10.

FIG. 11 is a circuit diagram of an example topology of the charge transfer circuitry 1000 of FIG. 10. The DC/DC converter 1002 comprises an inductor L1 coupled between a first inductor node N1 and a second inductor node N2 and a series of switches S1, S2, S3, S4, S5, S6. A first switching network comprising first, second and third switches S1, S2, S3 is configured to switchably couple the first inductor node N1 to each of the battery node NB, the output node NO and a voltage reference, in this case ground (GND). A second switching network comprising fourth, fifth and sixth switches S4, S5, S6 is configured to switchable couple the second inductor node N2 to each of the output node NO, the reservoir node NR and the voltage reference, in this case ground (GND).

The controller 310 may be configured to control the switches to operate the DC/DC converter 1002 in either continuous current mode (CCM) or discontinuous current mode (DCM), although it may be preferably to operate the DC/DC converter 1002 in CCM to maximise efficiency of the converter 1002.

FIGS. 12 to 14 are tables showing various switching regimes which may be implemented by the controller 310 to control the DC/DC converter 1002.

FIG. 12 illustrates an exemplary switching regime to increase charge on the reservoir capacitor CR.

During a first phase, the first and fourth switches S1, S4 are closed with the remaining switches open such that the battery node is coupled to the first inductor node N1 and the second inductor node N2 is coupled to the voltage reference such that the inductor L1 is energised from the battery 308.

During a second phase, the second and fifth switches S2, S5 are closed with the remaining switches open. The energised inductor L1 then deenergises via the reservoir capacitor CR, putting charge onto the reservoir capacitor CR.

FIG. 13 illustrates an exemplary switching regime for increasing charge on the load capacitor CL.

During a first phase, the first and fourth switches S1, S4 are closed with the remaining switches open such that the battery node is coupled to the first inductor node N1 and the second inductor node N2 is coupled to the voltage reference such that the inductor L1 is energised from the battery 308.

During a second phase, the first and sixth switches S2, S6 are closed with the remaining switches open. The energised inductor L1 then deenergises, putting charge onto the load capacitor CL.

FIG. 14 illustrates an exemplary switching regime for increasing charge on the load capacitor CL by discharging the reservoir capacitor CR.

During a first phase, the second and fifth switches S2, S5 are closed with the remaining switches open such that the first inductor node N1 is coupled to the voltage reference and the second inductor node N2 is coupled to the reservoir capacitor CR. The inductor L1 is energised from the reservoir capacitor CR.

During a second phase, the third and fourth switches S3, S4 are closed with the remaining switches open, such that the inductor L1 is coupled between the output node NO and the voltage reference (e.g. GND). In doing so, the inductor L1 deenergises, putting charge onto the load capacitor CL.

It is noted that this could also be achieved by closing the second and sixth switches S2, S6 with the remaining switches open.

Thus, the controller 310 may be configured to operate the DC/DC converter 1002 between these different modes to control charge transfer between the battery 308 and the output node NO.

In some embodiments, it may be necessary to establish multiple voltage for powering the AM device 302. For example, analog circuitry of the AM device 302 may operate a different (typically higher) voltage to digital circuitry of the AM device 302. In which case, a power supply may be required that is able to provide multiple voltages.

Figure 15:
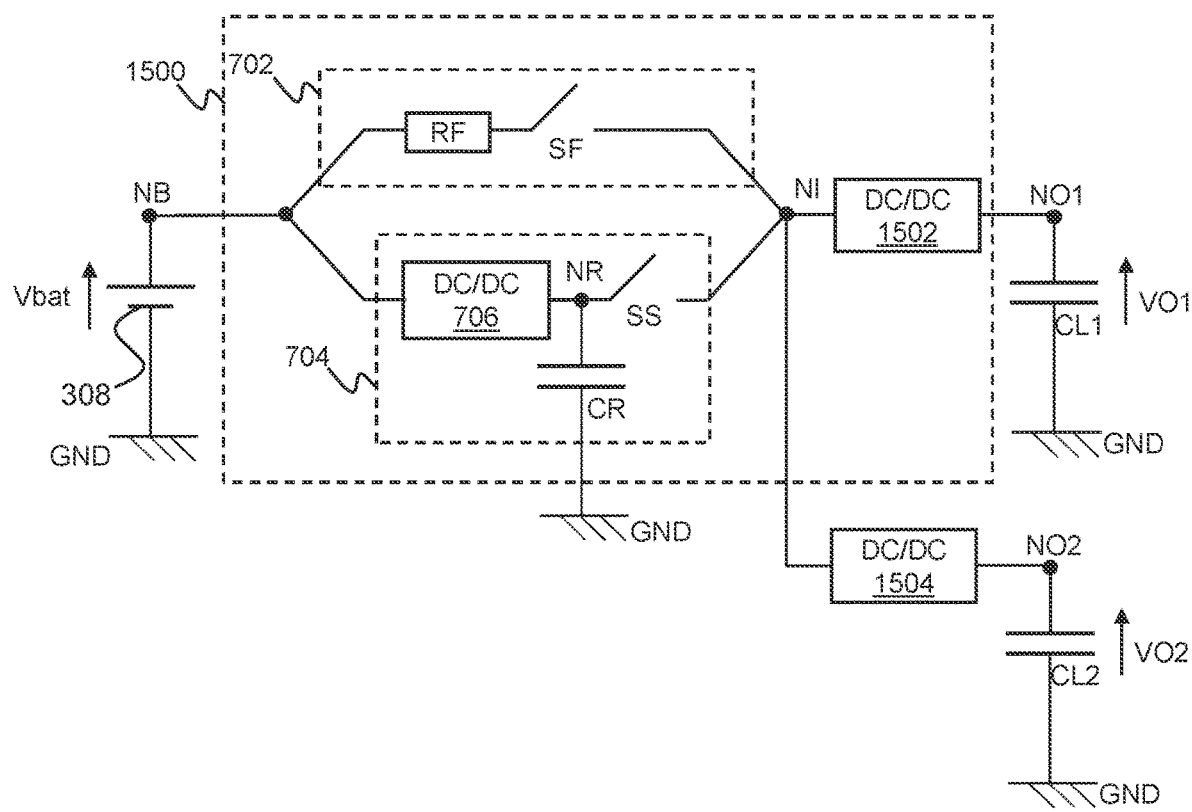
FIG. 15 is a schematic diagram of example charge transfer circuitry according to embodiments of the disclosure.

FIG. 15 is a schematic diagram of exemplary charge transfer circuitry 1500 according to some embodiments which is a variation of the charge transfer circuitry 700 shown in FIG. 7. Like parts have been given like reference numerals. The charge transfer circuitry 1500 differs from the charge transfer circuitry 700 of FIG. 7 with the addition of second and third DC/DC converters 1502, 1504. The second DC/DC converter 1502 is coupled between an interim node NI and a first output node NO1 for providing a first voltage VO1 to the AM device 302. The third DC/DC converter 1504 is coupled between the interim node NI and a second output node NO2 for providing a second output voltage VO2 to the AM device 302. The fast charge and slow charge switches SF, SS are coupled to the interim node NI. Optionally, the slow charge switch SS may be omitted.

The controller 310 may be configured to control operation of each of the second and third DC/DC converter 1502, 1504 to regulate the first and second output voltages VO1, VO2 at each of the output nodes NO1, NO2.

Thus, different voltages VO1, VO2 can be provided to the AM device 302 using the charge transfer circuitry 1500.

Figure 16:
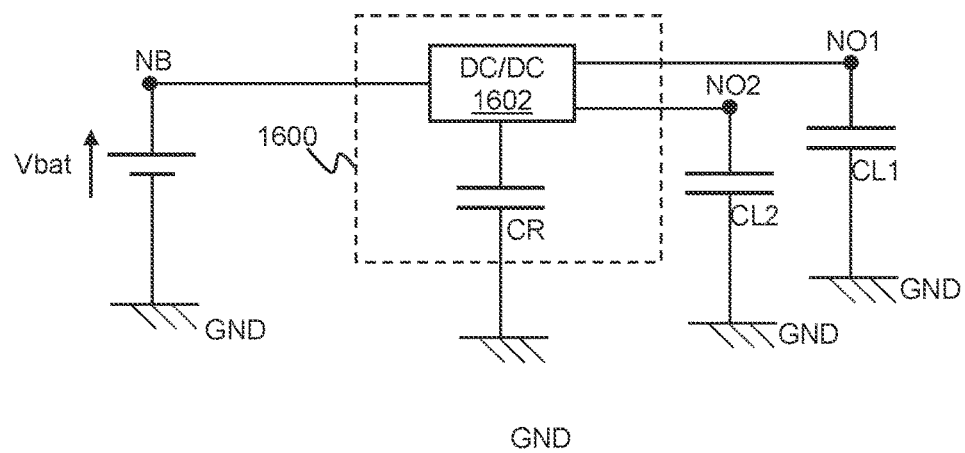
FIG. 16 is a schematic diagram of example charge transfer circuitry according to embodiments of the disclosure.

FIG. 16 is a schematic diagram of a further exemplary charge transfer circuitry 1600 according to some embodiments of the present disclosure which is a variation of the charge transfer circuitry 1000 shown in FIG. 10. The charge transfer circuitry 1600 comprises a single DC/DC converter 1602 and a reservoir capacitor CR. The DC/DC converter 1602 may comprise an inductor in combination with switching network operable to switch the battery voltage VB between charging the reservoir capacitor CR, supplying first and second load capacitors CL1, CL2.

Figure 17:
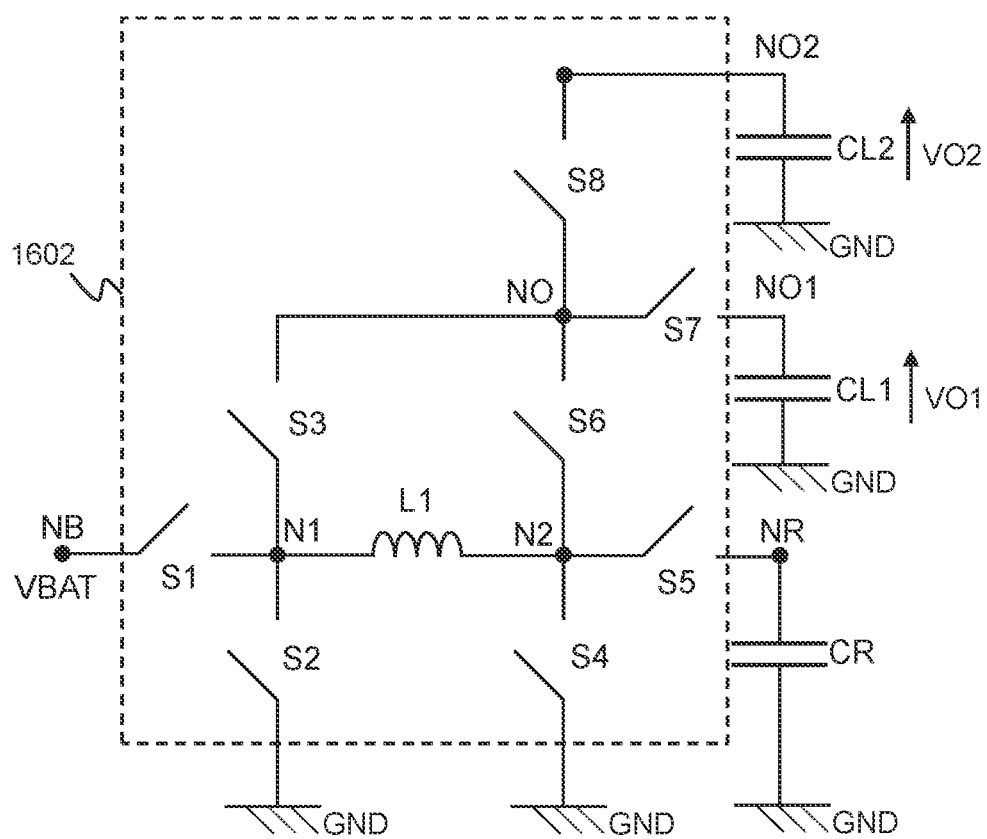
FIG. 17 is a circuit diagram of an example implementation of the charge transfer circuitry shown in FIG. 16.

FIG. 17 is a circuit diagram of an example topology of the DC/DC converter 1602 of FIG. 16 which is an extension of the topology shown in FIG. 11. The charge converter 1602 comprises an inductor L1 coupled between a first inductor node N1 and a second inductor node N2 and a series of switches S1, S2, S3, S4, S5, S6, S7, S8. First, second and third switches S1, S2, S3 are configured to switchably couple the first inductor node N1 to each of the battery node NB, an interim node NI and a voltage reference, in this case ground (GND). Fourth, fifth and sixth switches S4, S5, S6 is configured to switchable couple the second inductor node N2 to each of the interim node NI, the reservoir node NR and the voltage reference, in this case ground (GND). The seventh and eighth switches S7, S8 are configured to respectively couple the interim node NI to each of the first and second output voltage nodes NO1, NO2. Thus, the DC/DC converter 1602 may be controlled by the controller 310 to transfer charge onto each of the first and second load capacitors CL. The switches S1:S8 can therefore be controlled to regulate the voltages VO1, VO2 to be different.

In any of the above embodiments, it may be desirable to control the current limit of the one or more inductors comprised in the one or more DC/DC converters, to ensure an optimum current is being pulled from the respective batteries.

In some embodiments, the voltage VR across the reservoir capacitor CR may be monitored and the inductor current controlled based on the reservoir capacitor voltage VR. For a given measurement of duty cycle, the reservoir capacitor CR may be adjusted to be at its maximum voltage at the point at which a measurement is to be taken. If the voltage is too low, then the feedback loop may act to raise the current limit for the inductor thereby increasing the rate of transfer of charge to the reservoir capacitor. If, on the other hand, the voltage VR across the reservoir capacitor is reaching maximum voltage too early, then the feedback loop may act to lower the current limit for the inductor.

Whilst in embodiments described herein, the system 300 and various charge transfer circuitry 312, 600, 700, 800, 900, 1000, 1500, 1600 are generally described as providing charge to an analyte monitoring device, embodiments of the present disclosure are not limited to such applications. For example, the systems described herein may be used to provide power to any wearable medical device and may be particularly applicable to application where a device is periodically powered up to perform a function. Examples of such medical devices include but are not limited to drug delivery devices (insulin pumps etc.), and devices for measuring electrocardiographs (ECG devices), electroencephalographs (EEG devices), oxygen saturation, heartbeat etc. Examples extend to smart watches and other wearable devices implementing such technologies.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the disclosure will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog TM or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the disclosure, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. An apparatus for delivering power from a battery node of a battery to an output node, the output node coupled to an analyte monitoring device, the apparatus comprising:
   a slow charging path between the battery node and the output node;
   a fast charging path parallel to the slow charging path, the fast charging path switchably coupled between the battery node and the output node; and
control circuitry configured to:
   selectively couple the fast charging path between the battery node and the output node to allow faster transfer of charge between the battery node and the output node than the slow charging path;
   wherein the slow charging path comprises:
      a reservoir capacitor coupled between a reservoir node in the slow charging path and a second reference voltage; and
      a first voltage regulator coupled between the battery node and the reservoir node for regulating a reservoir voltage at the reservoir node;
   the apparatus further comprising a third voltage regulator in the fast charging path configured to regulate the input voltage at he output node when the fast charging path is coupled between the battery node and the output node.

2. The apparatus of claim 1, wherein the slow charging path is switchably coupled between the battery node and the output node, and wherein the control circuitry is configured to:
   selectively couple the slow charging path between the battery node and the output node in dependence of an internal state of the battery.

3. The apparatus of claim 2, wherein the slow charging path is permanently coupled between the battery node and the output node.

4. The apparatus of claim 1, wherein the control circuitry is configured to selectively couple the fast charging path between the battery node and the output node in dependence on an internal state of the battery.

5. The apparatus of claim 4, wherein the control circuitry is configured to:
   measure a characteristic of the battery via the battery node; and
   estimate the internal state of the battery based on the characteristic.

6. The apparatus of claim 1, wherein the control circuitry is configured to selectively coupled the fast charging path between the battery node and the output node in dependence on a duty cycle of sampling by the analyte monitoring device.

7. The apparatus of claim 1, wherein the control circuitry is configured to:
   selectively coupled the fast charging path between the battery node and the output node in dependence on whether the analyte monitoring device is sampling an analyte.

8. The apparatus of claim 1, wherein the control circuitry is configured to selectively coupled the fast charging path between the battery node and the output node in dependence on an output voltage at the output node.

9. The apparatus of claim 1 wherein the control circuitry is configured to selectively couple the fast charging path between the battery node and the output node in response to one or more of:
   a request for data from the analyte monitoring device;
   a concentration of an analyte measured by the analyte monitoring device exceeding a high concentration threshold;
   a concentration of an analyte measured by the analyte monitoring device falling below a low concentration threshold.

10. The apparatus of claim 9, further comprising:
    a load capacitor coupled between the output node and a first reference voltage.

11. The apparatus of claim 1, wherein the slow charging path has a higher resistance than the fast charging path.

12. The apparatus of claim 1, further comprising:
    a second voltage regulator coupled between the reservoir node and the output node for regulating an input voltage at the output node.

13. The apparatus of claim 1, wherein the fast charging path passes through the reservoir node and the second voltage regulator.

14. The apparatus of claim 1, wherein the first voltage regulator comprises:
    first and second inductor nodes for coupling an inductor therebetween; and
    a switching network configured to switchably couple:
       the first inductor node to one or more of the battery node, the output node and a second voltage reference node; and
       the second inductor node to one or more of the reservoir node, the output node and the second voltage reference node.

15. The apparatus of claim 14, wherein the fast charging path and the slow charging path pass through the switching network.

16. A system comprising:
    the apparatus of claim 1; and
    the analyte monitoring device.

17. The system of claim 16, further comprising a host device in communication with the apparatus and/or the analyte monitoring device.

18. A method for controlling an apparatus for delivering power from a battery node of a battery to an output node, the output node coupled to an analyte monitoring device, the apparatus comprising a slow charging path between the battery node and the output node, and a fast charging path parallel to the slow charging path, the fast charging path switchably coupled between the battery node and the output node;
    wherein the slow charging path comprises:
       a reservoir capacitor coupled between a reservoir node in the slow charging path and a second reference voltage; and
       a first voltage regulator coupled between the battery node and the reservoir node for regulating a reservoir voltage at the reservoir node;
    wherein the apparatus further comprises a third voltage regulator in the fast charging path configured to regulate the input voltage at the output node when the fast charging path is coupled between the battery node and the output node;
    the method comprising:

selectively coupling the fast charging path between the battery node and the output node to allow faster transfer of charge between the battery node and the output node than the slow charging path.

* * * * *

UNITED STATES PATENT AND TRADEMARK OFFICE
CERTIFICATE OF CORRECTION

PATENT NO. : 12,266,961 B2
APPLICATION NO. : 17/824687
DATED : April 1, 2025
INVENTOR(S) : Lesso et al.

It is certified that error appears in the above-identified patent and that said Letters Patent is hereby corrected as shown below:

In the Claims

1. In Column 19, Lines 31-32, in Claim 1, delete "the input voltage" and insert -- an input voltage --, therefor.

2. In Column 19, Line 32, in Claim 1, delete "he" and insert -- the --, therefor.

3. In Column 19, Line 56, in Claim 6, delete "coupled" and insert -- couple --, therefor.

4. In Column 19, Line 62, in Claim 7, delete "coupled" and insert -- couple --, therefor.

5. In Column 19, Line 67, in Claim 8, delete "coupled" and insert -- couple --, therefor.

6. In Column 20, Line 3, in Claim 9, delete "claim 1" and insert -- claim 1, --, therefor.

7. In Column 20, Lines 22-23, in Claim 12, delete "an input voltage" and insert -- the input voltage --, therefor.

8. In Column 20, Lines 25-26, in Claim 13, delete "the second voltage regulator." and insert -- a second voltage regulator. --, therefor.

9. In Column 20, Line 64, in Claim 18, delete "the input voltage" and insert -- an input voltage --, therefor.

Signed and Sealed this
Thirteenth Day of January, 2026

John A. Squires
*Director of the United States Patent and Trademark Office*